United States Patent
Yang et al.

(10) Patent No.: US 6,342,135 B1
(45) Date of Patent: Jan. 29, 2002

(54) SPUTTER ETCHING CHAMBER WITH IMPROVED UNIFORMITY

(75) Inventors: Chin-Shien Yang, Hsinchu; Chuan-Huai Chen, Taipei; Cheng-Kun Lin, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 1031 days.

(21) Appl. No.: 08/552,245

(22) Filed: Nov. 2, 1995

(51) Int. Cl.$^7$ .................................. C23C 14/34
(52) U.S. Cl. ..................... 204/192.37; 204/192.32; 204/298.33
(58) Field of Search ............. 204/192.32, 192.37, 204/198.31, 198.33; 156/345, 643.1, 662.1; 216/67, 71, 79

(56) References Cited

U.S. PATENT DOCUMENTS

| | | | |
|---|---|---|---|
| 3,661,761 A | | 5/1972 | Koeng .................... 204/298 |
| 3,733,258 A | * | 5/1973 | Hanak et al. .......... 204/192.32 |
| 4,512,283 A | * | 4/1985 | Bonifield et al. ........... 156/345 |
| 4,600,464 A | * | 7/1986 | Desilets et al. ........ 204/298.34 |
| 4,647,338 A | * | 3/1987 | Visser .................... 156/643.1 |
| 4,718,976 A | * | 1/1988 | Fujimura ............... 204/298.33 |
| 5,277,751 A | | 1/1994 | Ogle ....................... 156/643 |
| 5,389,197 A | * | 2/1995 | Ishimaru ..................... 216/67 |

OTHER PUBLICATIONS

Maissel et al., "Handbook of Film Technology", 1970, McGraw–Hill pp. 7–50–7–53.*

* cited by examiner

Primary Examiner—Rodney G. McDonald
(74) Attorney, Agent, or Firm—George O. Saile; Stephen B. Ackerman

(57) ABSTRACT

The uniformity of material removal, as well as contamination due to deposited particulate matter, has been reduced in single wafer sputter-etchers by providing an improved gas baffle. Said gas baffle presents a smooth surface to the incoming sputtering gas so that it disperses uniformly throughout the sputtering chamber, thereby avoiding local fluctuations in pressure which, in turn, can lead to local differences in material removal rate as well as to particulate contamination of the surface that is being etched. The design of the baffle is described along with a method for attaching it to the inside of the sputtering shield.

6 Claims, 3 Drawing Sheets

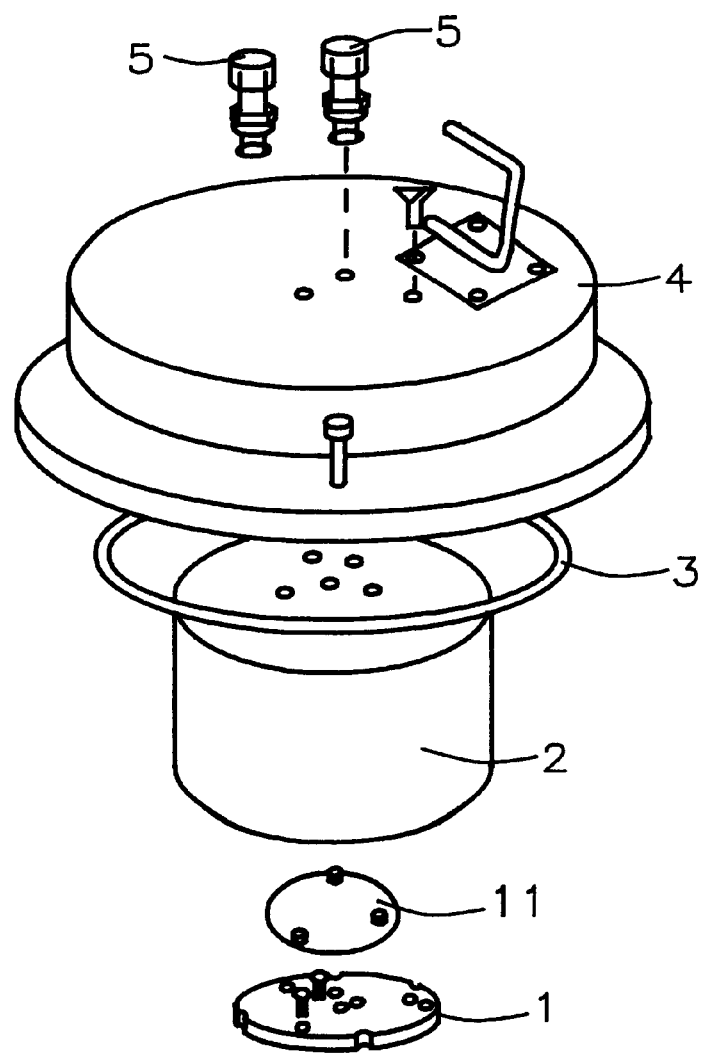
FIG. 1 - Prior Art

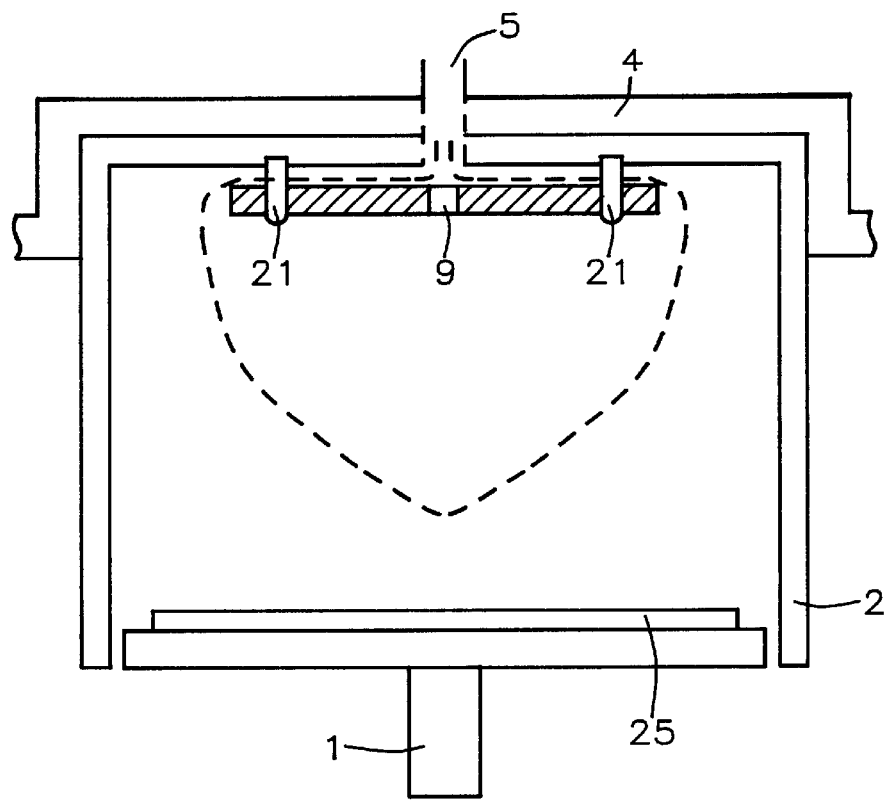
FIG. 2 – Prior Art
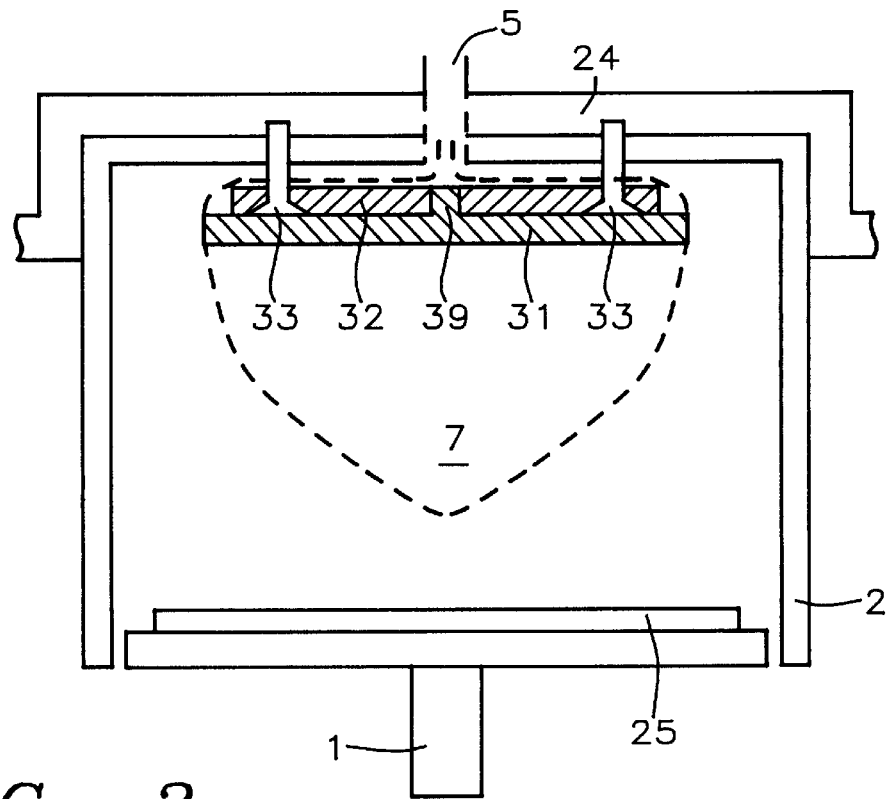
FIG. 3

SPUTTER ETCHING CHAMBER WITH IMPROVED UNIFORMITY

BACKGROUND OF THE INVENTION (1) Field of the Invention

The invention relates to the general field of etching by non chemical means, particularly RF sputter-etching.

(2) Description of the Prior Art

RF (radio frequency) sputter-etching is a universal etching technique, although the actual rate at which material gets removed does vary from one material to another. DC (direct current) sputter-etching is similar, but is limited to electrically conductive material, which RF sputter-etching is not. The basic setup is to provide two electrodes—a substrate holder and a sputtering shield, immerse them in gas at low pressure and apply an RF voltage between them.

FIG. 1 shows an exploded isometric view of part of a standard sputter-etcher of this type, in this case Electrotech's model MS6210 which was used in the development and reduction to practice of the present invention. During use, silicone oil cooled substrate holder 1 is positioned just inside the open lower portion of sputtering shield 2. Air cooled lid 4 is attached to 2 along with vacuum tight O-ring seal 3. The various attachments labelled as 5 include means for admitting the sputtering gas through lid 4 and controlling its pressure, as well as means for applying the RF power.

FIG. 2 is a schematic cross-section of FIG. 1. Gas baffle 11 serves the important purpose of dispersing the stream of incoming gas to reduce local variations in pressure within the sputtering chamber. It is customarily attached to shield 11 by standard round-headed screws, such as 21 and a space is allowed between it and the underside of 2. Incoming gas is forced to flow round to the sides of the baffle whose actual position within shield 2 can be seen in FIG. 2.

Not shown in FIGS. 1 and 2 is a vacuum chamber within which the sputter etcher resides during use. An appropriate sputtering gas (usually argon) is admitted into said vacuum chamber during use, its admission rate being adjusted so that some particular desired pressure level can be maintained. Said pressure is commonly about $6 \times 10^{-3}$ torr. RF voltage is applied between the substrate holder and the sputtering shield, initiating an RF glow discharge, and material is removed from both electrodes at a rate that is inversely proportional to some power (between 1 and 4, depending on the exact geometry) of the ratio of their two areas. See, for example, Koenig in U.S. Pat. No. 3,661,761 May 9, 1972. Since the area of the substrate holder is, by design, significantly less than that of the sputtering shield, the rate at which material will be removed from the substrate (assumed to be covering almost the entire substrate holder surface) will be substantially greater than the rate of material removal from the sputtering shield.

Sputter-etchers of the type illustrated in FIGS. 1 and 2 are intended for the sputter-etching of a single semiconductor wafer at a time. This allows for better control of the amount of material removed from different wafers than is possible in a batch system which processes many wafers at a time. However, in order to make the throughput of such a system economically attractive in a manufacturing environment, it is necessary that the time taken to etch a given wafer be kept as low as possible. This implies that significantly higher etch rates, and therefore significantly higher levels of RF power density, must be used relative to the batch methods. To avoid the need for very high RF voltages to achieve these high power densities (typically about 300 watts per wafer) these single wafer etchers operate at higher gas pressures (where plasma resistance is lower) than do the batch units.

This use of high pressure, and particularly high power, is known to have certain undesirable side effects, notably the non-uniform removal of material and the generation of fine dust particles, some of which find their way onto the surface that was sputter-etched. Any particulate matter of this type, if allowed to settle on the surface of an integrated circuit during the course of its manufacture, has a high probabilty of destroying said circuit, thus reducing the overall product yield.

A number of possible sources of non-uniformity of material removal and of particulate contamination are believed to exist. One of these is the effect of local fluctuations in gas pressure during sputtering. With improper baffle design the local density of the incoming gas during sputter etching can vary and therefore so will the plasma density. As a result, there will be small local variations in the sputter etch rate, leading to non-uniformity in the amount of material removed across the surface of wafer 25 in FIG. 2. Broken line 20 shows a profile of peak density for the incoming gas. Note that the low point of said profile is still some distance above the center of silicon wafer 25. This is believed to be a result of the relatively high gas flow rate associated with this baffle design.

The solution to these problems, which forms the subject matter of the present invention, involves the redesign of the gas inlet baffle 11 so that the afore-mentioned local fluctuations in gas density are much reduced.

SUMMARY OF THE INVENTION

It is an object of the present invention to provide a sputter-etcher in which material is removed from a substrate to a high degree of uniformity.

It is a further object of the present invention to provide a sputter-etcher that generates a low level of particulate contamination during use.

Yet another object of the present invention is to provide a method for the use of such a sputter-etcher.

These objects have been achieved by providing an improved gas baffle design and locating and attaching said gas baffle in the proper manner.

BRIEF DESCRIPTION OF THE DRAWINGS

FIG. 1 shows an exploded view of part of a commercially available sputter-etcher.

FIG. 2 shows a schematic cross-section of the etcher of FIG. 1.

FIG. 3 is a schematic cross-sectional view of the sputter etcher as modified according to the teachings of the present invention.

DESCRIPTION OF THE PREFERRED EMBODIMENTS

Figure 4:
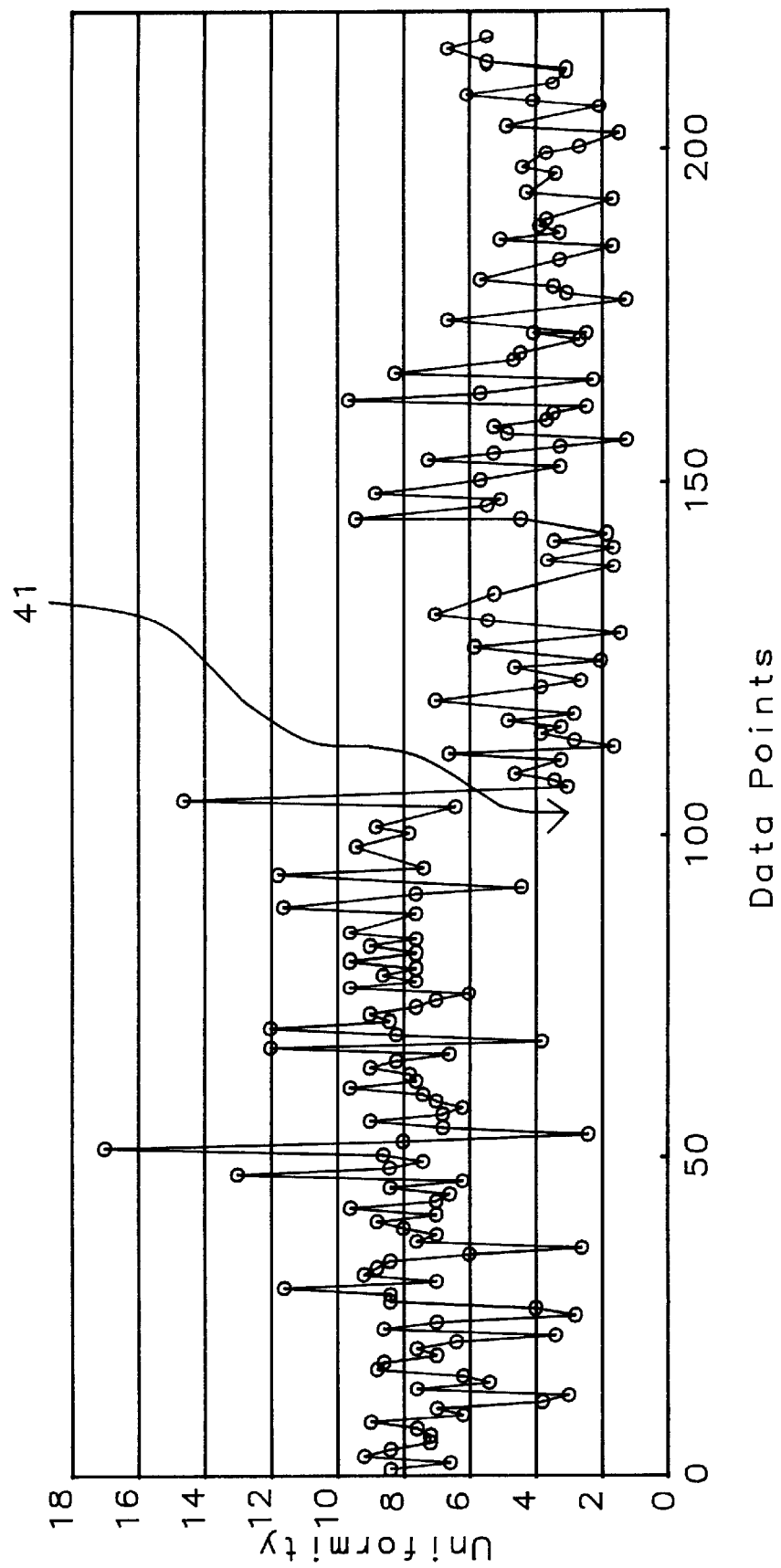
FIG. 4 is a plot of uniformity-of-removal data with and without the new baffle.

Referring now to FIG. 3, we show in schematic cross-section, the parts that have been modified as part of the present invention with respect to the sputter-etcher shown in FIGS. 1 and 2. A substrate holder 1, supporting substrate 25 (such as a silicon wafer), is positioned just inside sputtering shield 2. Lid 24, including gas admission inlet 5, sits on top of shield 2. The gas baffle, comprising plates 31 and 32, is located inside shield 2 a short distance below the underside of 2. When an RF glow discharge is initiated in region 7 (by applying an RF voltage between about 1,500 and 1,750 volts), material from the surface of 25 is removed at a steady rate which is typically about 200 Angstrom units per minute. The present invention, as we will describe it below, is actually applicable to a wider range of deposition rates— from about 175 to about 230 Angstrom units per minute.

Continuing our reference to FIG. 3, it is seen that the gas baffle has been redesigned so that no rough protuberances (such as screw heads 21 in FIG. 2) are present. This has been achieved by attaching plate 32 (the old baffle 11 of FIG. 2) by means of flat-headed screws 33 in place of the round-headed screws 21 that were used in the prior art. Said flat-headed screws were counter sunk into the lower surface of 32 so that said surface remained uniformly planar. An opening was formed and provided with an internal screw thread so that threaded rod 39, attached to the upper surface of 31, could be screwed into it, thereby pulling lower plate 31 into close contact with upper plate 32, as can be seen in FIG. 3.

In order to assemble the baffle pictured in FIG. 3, plate 31 is attached to the inside surface of shield 2 in the same manner as had been used in the prior art except that the lower ends of the screw holes are countersunk so that flat-head screws 33 may be used. The lengths of 33 and the depths of the holes in the inner surface of 2 are chosen so that when screws 33 are firmly in place the upper surface of plate 32 is between 4 and 7 mm. a way from the inner surface of 2. Threaded rod 39 is then screwed into hole described above. It is important to make sure that 39 is truly perpendicular to the upper surface of 31 so that said surface will contact the lower surface of 32 evenly, once 39 has been screwed in far enough. Once the surfaces of the two plates are in close contact, the baffle is ready for use.

An additional feature of the present invention, not mentioned so far, is that the surface of the baffle should be roughened. Our preferred method for doing this has been to coat the baffle surface with a layer of arc-sprayed aluminum, but any method for roughening the surface could be used. This feature, in combination with a reduction in the separation between the baffle and the sputtering shield walls (at both the horizontal and the vertical surfaces) serves to reduce the flow rate of the gas and leads to the peak gas concentration profile shown as broken line 30 in FIG. 3. As can be seen, said profile comes closer to the center of wafer 25 than was the case in prior art FIG. 2, thereby reducing the tendency to overetch the wafer at its center.

In FIG. 4 we show the uniformity of removal, expressed as ((greatest depth of removal—smallest depth of removal) *2)/2×average depth of removal (expressed as %). Initially, the sputter etcher was used with a gas baffle of the type common in the prior art (see FIG. 1, for example). After run 106 (pointed to as 41 in FIG. 4) the new baffle was introduced. As can be seen, the mean uniformity changed from greater than 7%, prior to point 41, to less than 5% following point 41. Additionally, we have observed a distinct reduction in the amount of particulate matter contaminating our product since we started using gas baffles built in accordance with the teachings of the present invention.

While the invention has been particularly shown and described with reference to this preferred embodiment, it will be understood by those skilled in the art that various changes in form and details may be made without departing from the spirit and scope of the invention.

What is claimed is:

1. A method for improving the uniformity of material removal and for reducing the amount of particulate contamination in a sputter-etcher comprising:

providing a sputter-etcher that includes a substrate holder and a sputtering shield;

attaching a gas baffle that comprises a disk having unbroken, upper and lower surfaces, inside said sputtering shield; and admitting gas during sputtering through an inlet centrally located above said gas baffle.

2. A method for sputter-etching comprising:

providing a substrate that is to be sputter-etched;

providing a sputter-etcher that includes a substrate holder and a sputtering shield;

attaching a gas baffle that comprises a disk having unbroken, upper and lower surfaces, to said sputtering shield;

placing said substrate on said substrate holder and positioning it inside said sputtering shield;

evacuating said sputter-etcher while at the same time admitting gas through an inlet centrally located above said gas baffle, thereby maintaining a pressure inside said sputter etcher; and applying an RF voltage between the sputtering shield and the substrate holder.

3. The method of claim 2 wherein said gas that is admitted comprises argon.

4. The method of claim 2 wherein the pressure during sputter-etching is between about $4 \times 10^{-3}$ and about $7.5 \times 10^{-3}$ torr.

5. The method of claim 2 wherein said applied RF voltage is between about 1,500 and about 1,750 volts.

6. The method of claim 2 wherein said substrate comprises a silicon wafer.

* * * * *